(12) United States Patent
Angerer et al.

(10) Patent No.: US 10,025,754 B2
(45) Date of Patent: Jul. 17, 2018

(54) LINEAR FE SYSTEM SOLVER WITH DYNAMIC MULTI-GRIP PRECISION

(71) Applicant: International Business Machines Corporation, Armonk, NY (US)

(72) Inventors: Christoph M. Angerer, Zurich (CH); Konstantinos Bekas, Horgen (CH); Alessandro Curioni, Gattikon (CH); Heiner Giefers, Langnau am Albis (CH); Christoph Hagleitner, Wallisellen (CH); Yves G. Ineichen, Zurich (CH); Raphael Polig, Dietikon (CH)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 14/805,526

(22) Filed: Jul. 22, 2015

(65) Prior Publication Data

US 2017/0024356 A1    Jan. 26, 2017

(51) Int. Cl.
*G06F 17/12*   (2006.01)
*G06F 17/50*   (2006.01)

(52) U.S. Cl.
CPC ............. *G06F 17/12* (2013.01); *G06F 17/50* (2013.01)

(58) Field of Classification Search
CPC ...... G06F 17/11–17/12; G06F 19/3437; A61B 2034/105; A61B 2090/367; A61B 6/5217; A61B 8/483
See application file for complete search history.

(56) References Cited

U.S. PATENT DOCUMENTS

| | | |
|---|---|---|
| 8,711,146 B1 | 4/2014 | Miller et al. |
| 2011/0010409 A1 | 1/2011 | DeLaquil et al. |
| 2011/0320768 A1 | 12/2011 | Pell et al. |
| 2012/0005247 A1 | 1/2012 | Bekas et al. |

OTHER PUBLICATIONS

P. Arbenz, G.H. van Lenthe, U. Mennel, R. Müller, and M. Sala, "A scalable multi-level preconditioner for matrix-free μ-finite element analysis of human bone structures," Int. J. for Numerical Methods in Engineering vol. 73, pp. 927-947, 2008.*

C. Flaig, "A highly scalable memory efficient multigrid solver for μ-finite element analyses", Doctoral dissertation, Eidgenössische Technische Hochschule (ETH) Zürich, 2012.*

(Continued)

*Primary Examiner* — Matthew Sandifer
(74) *Attorney, Agent, or Firm* — Noah A. Sharkan; Brian M. Restauro

(57) ABSTRACT

Embodiments of the present invention provide methods, computer program products, and systems for solving a linear equation system using a hardware-implemented extended solver, wherein a calculation precision is adapted in each iteration step of a solving process is provided. Embodiments of the present invention can be used to perform on-the-fly interpolations using the data associated with the highest resolution of the three-dimensional finite element voxel model to a lower resolution than the highest resolution as well as to perform solving computations of the solving process in the lower resolution.

17 Claims, 5 Drawing Sheets

(56) References Cited

OTHER PUBLICATIONS

Arbenz et al., "Bone structure analysis on multiple GPGPUs", ETH Zurich, Computer Science Department, Universitatsstrasse 6, 8092 Zurich, Switzerland, Preprint submitted to Journal of Parallel and Distributed Computing, Jan. 15, 2014, pp. 1-18.

Blelloch et al., "Hierarchical Diagonal Blocking and Precision Reduction Applied to Combinatorial Multigrid", Computer Science Department, Carnegie Mellon University, pp. 1-12, SC10 Nov. 2010, New Orleans, Louisiana, USA 978-1-4244-7558-2/10/, © 2010 IEEE.

Goddeke et al., "Cyclic Reduction Tridiagonal Solvers on GPUs Applied to Mixed-Precision Multigrid", IEEE Transactions on Parallel and Distributed Systems, vol. 22, No. 1, Jan. 2011, pp. 22-32, published online Mar. 31, 2010, Digital Object Identifier No. 10.1109/TPDS.2010.61, © 2011 IEEE.

\* cited by examiner

LINEAR FE SYSTEM SOLVER WITH DYNAMIC MULTI-GRIP PRECISION

BACKGROUND OF THE INVENTION

The invention relates generally to a solver for a linear equation system, and specifically, for solving a linear equation system using a hardware-implemented extended solver.

Numerically solving large scale linear equation systems is a common task in many applications from business to engineering domains. Generally, algorithms solving such systems are mainly devised into direct methods (e.g., LU factorization (Lower/Upper)) and iterative methods, (e.g., conjugate gradient). A practical application of such algorithms can be applied to problems of linear bone elasticity.

An underlying scientific and technical question may be embedded in the following concept: A 2D scanner may capture a series of images. These series of images may represent slices of a 3D volume structure. Based on the slices of the 3D volume structure, a high resolution voxel model may be constructed. The high resolution voxel model may, for example, relate to a stiffness matrix describing the stiffness of a body being presented by the slice images. In order to simulate a force acting on the 3D structure, the stiffness matrix and a vector describing the physical force may be used as input variables for an iterative solver adapted for solving a linear equation system. As a result, the solver may output displacement vectors. These may be transformed into a graphical representation such that a skilled person may be able to interpret the results.

SUMMARY

In one embodiment of the present invention a method for solving a linear equation system using a hardware-implemented extended solver, wherein a calculation precision is adapted in each iteration step of a solving process is provided. The method includes storing data associated with a highest resolution of a three-dimensional finite element voxel model in a memory. The method further includes performing on-the-fly interpolations using the data associated with the highest resolution of the three-dimensional finite element voxel model to a lower resolution than the highest resolution. The method further includes performing solving computations of the solving process in the lower resolution.

According to another embodiment of the present invention, a computer program product for solving a linear equation system using a hardware-implemented extended solver, wherein a calculation precision is adapted in each iteration step of a solving process is provided. The computer program product includes one or more computer readable storage media and program instructions stored on the one or more computer readable storage media. The program instructions include program instructions to store data associated with a highest resolution of a three-dimensional finite element voxel model in a memory. The program instructions further include program instructions to perform on-the-fly interpolations using the data associated with the highest resolution of the three-dimensional finite element voxel model to a lower resolution than the highest resolution. The program instructions further include program instructions to perform solving computations of the solving process in the lower resolution.

In yet another embodiment of the present invention, a computer system for solving a linear equation system using a hardware-implemented extended solver, wherein a calculation precision is adapted in each iteration step of a solving process is provided. The computer system includes one or more computer processors, one or more computer readable storage media, and program instructions stored on the one or more computer readable storage media for execution by at least one of the one or more processors. The program instructions include program instructions to store data associated with a highest resolution of a three-dimensional finite element voxel model in a memory. The program instructions further include program instructions to perform on-the-fly interpolations using the data associated with the highest resolution of the three-dimensional finite element voxel model to a lower resolution than the highest resolution. The program instructions further include program instructions to perform solving computations of the solving process in the lower resolution.

BRIEF DESCRIPTION OF THE DRAWINGS

It should also be noted that embodiments of the invention are described with reference to different subject matter. In particular, some embodiments are described with reference to method type claims whereas other embodiments are described with reference to apparatus type claims. However, a person skilled in the art will understand from the description that any combination of features belonging to one type of subject matter, as well as any combination between features relating to different subject matter with respect to features between the method and apparatus claims, are considered to be disclosed within this document unless otherwise notified.

The aspects defined above and further aspects of the present invention are apparent from the examples of embodiments to be described hereinafter and are explained with reference to the examples of embodiments, but to which the invention is not limited.

Figure 1:
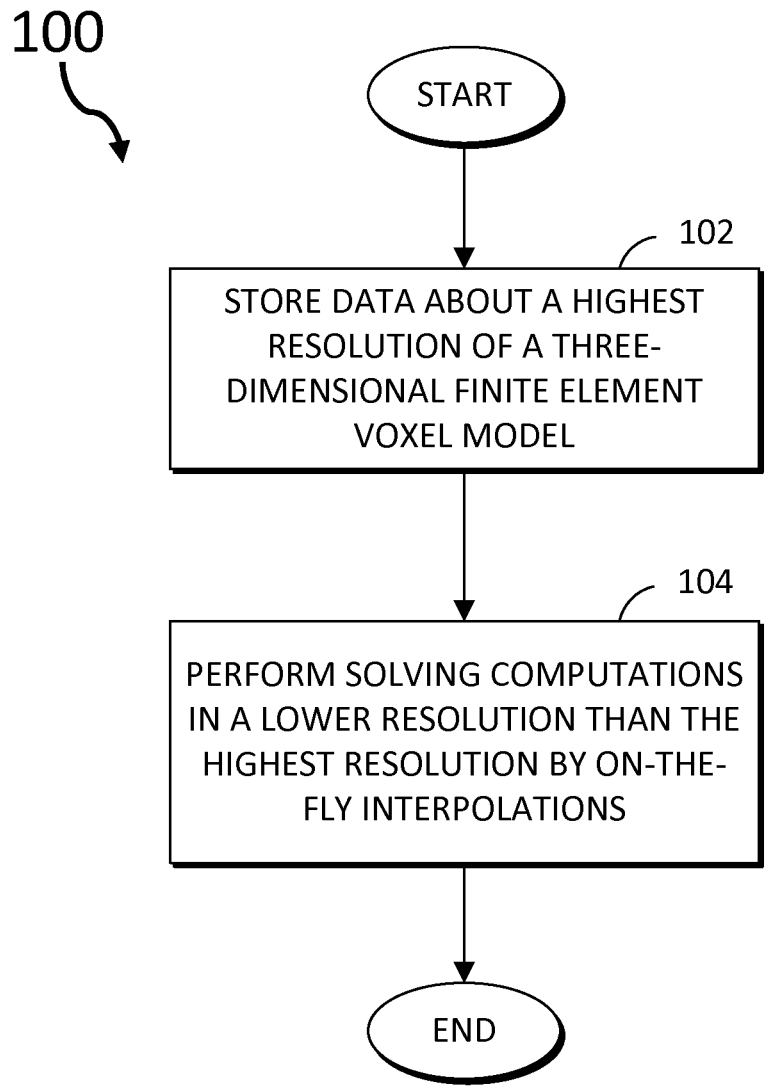
Figure 2:
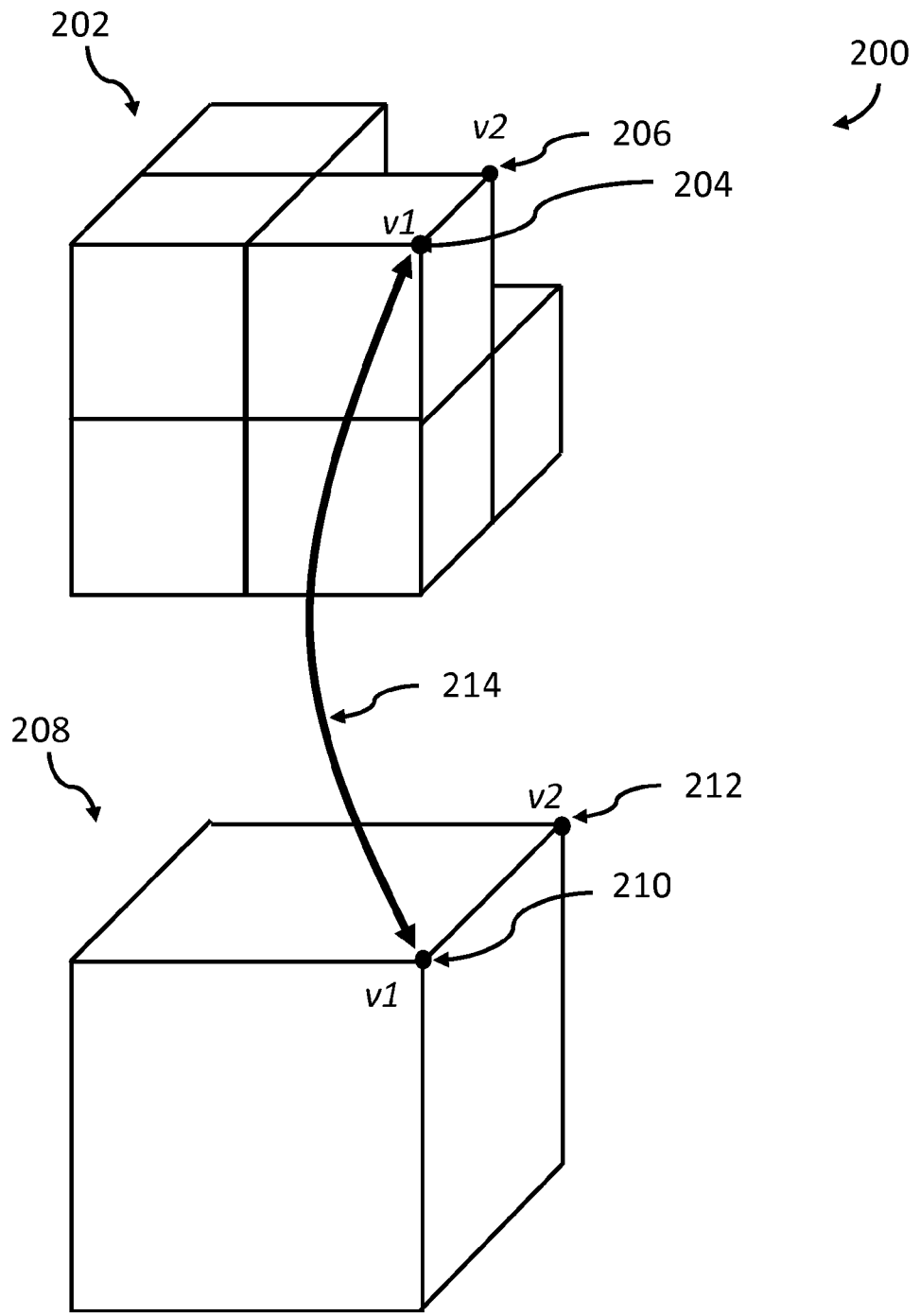
Figure 3:
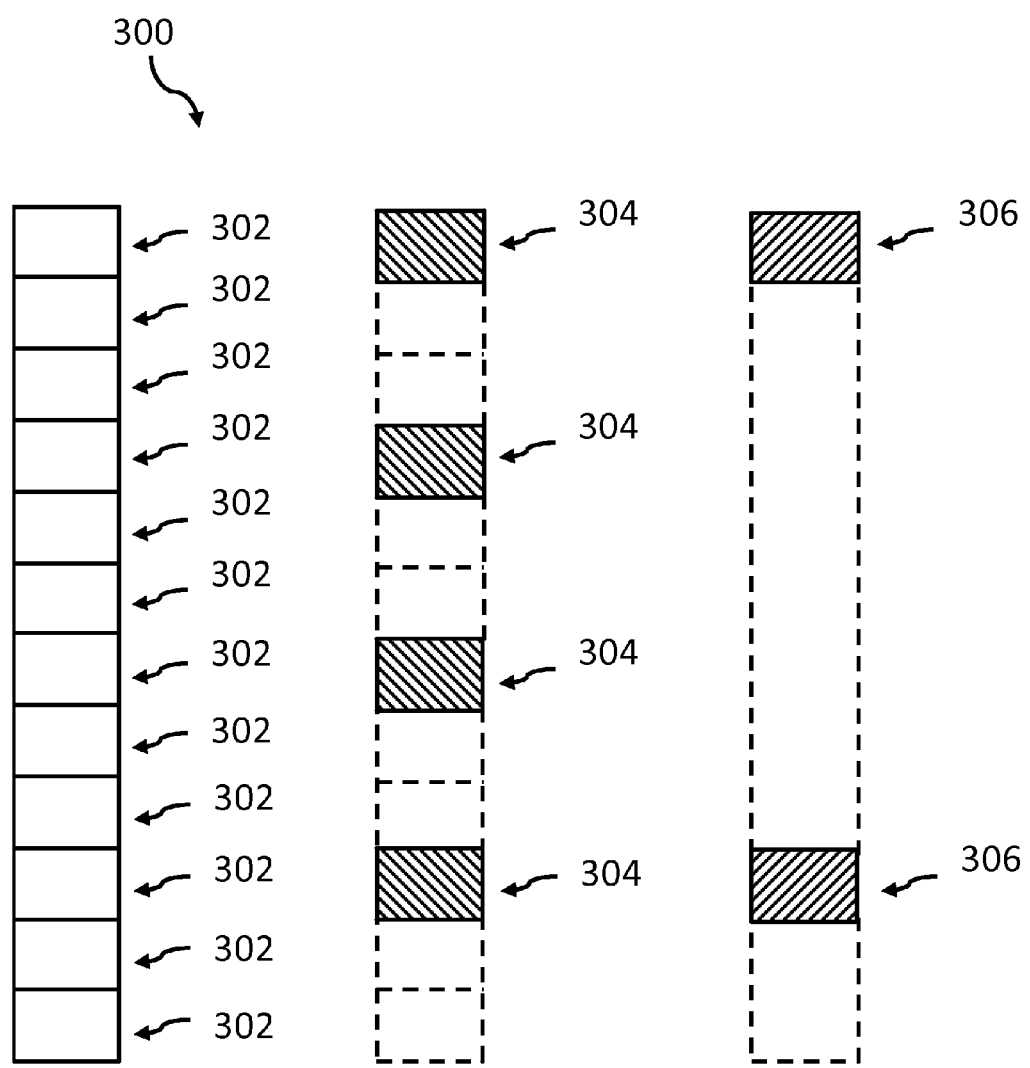
Figure 4:
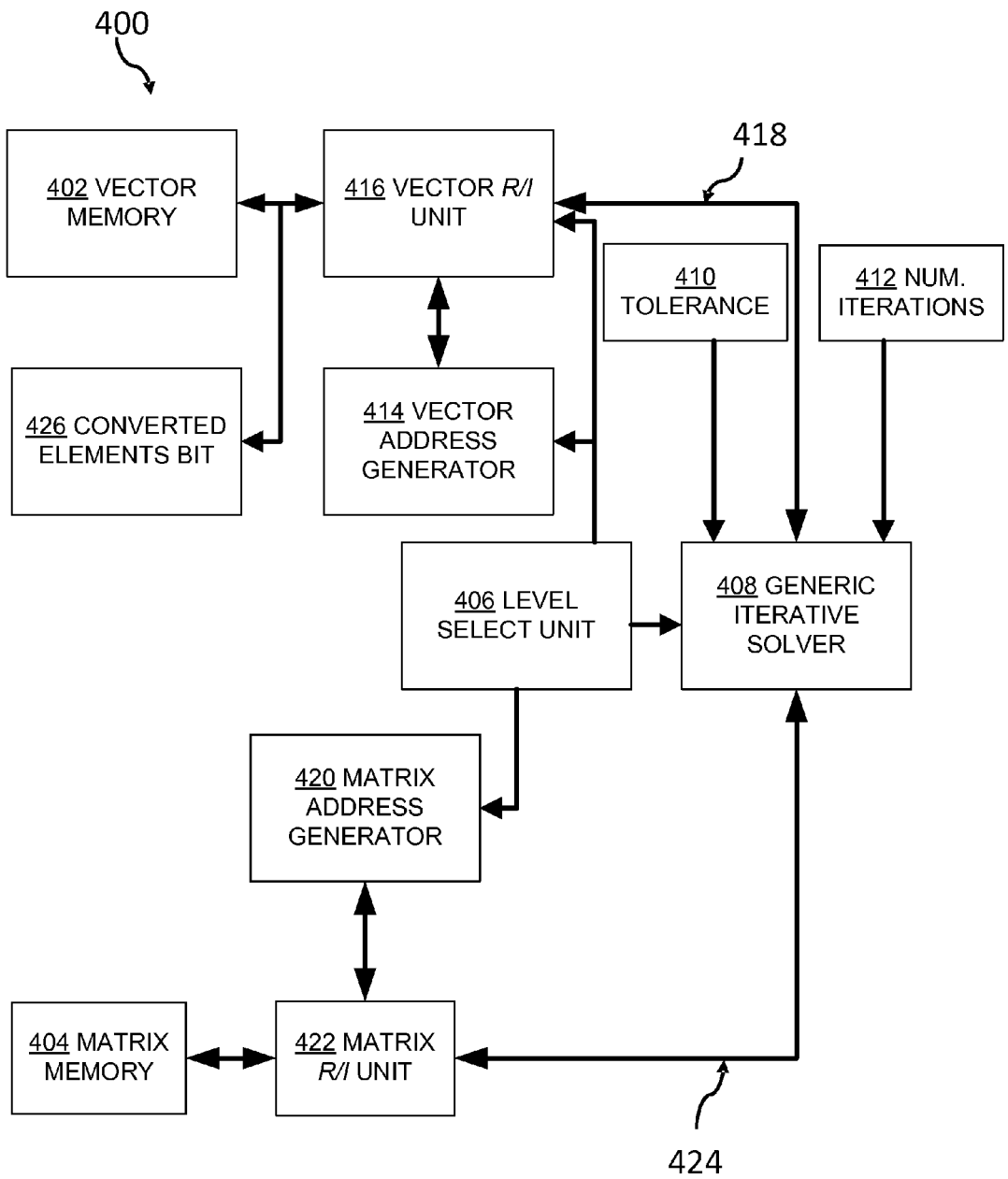
Figure 5:
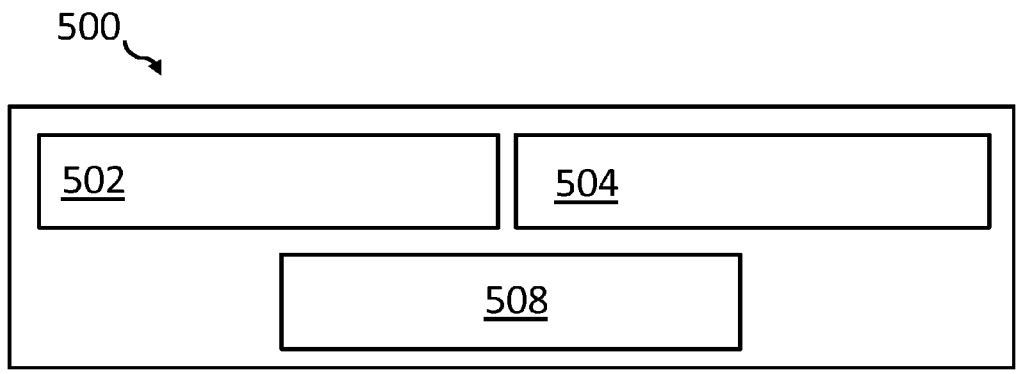
Figure 6:
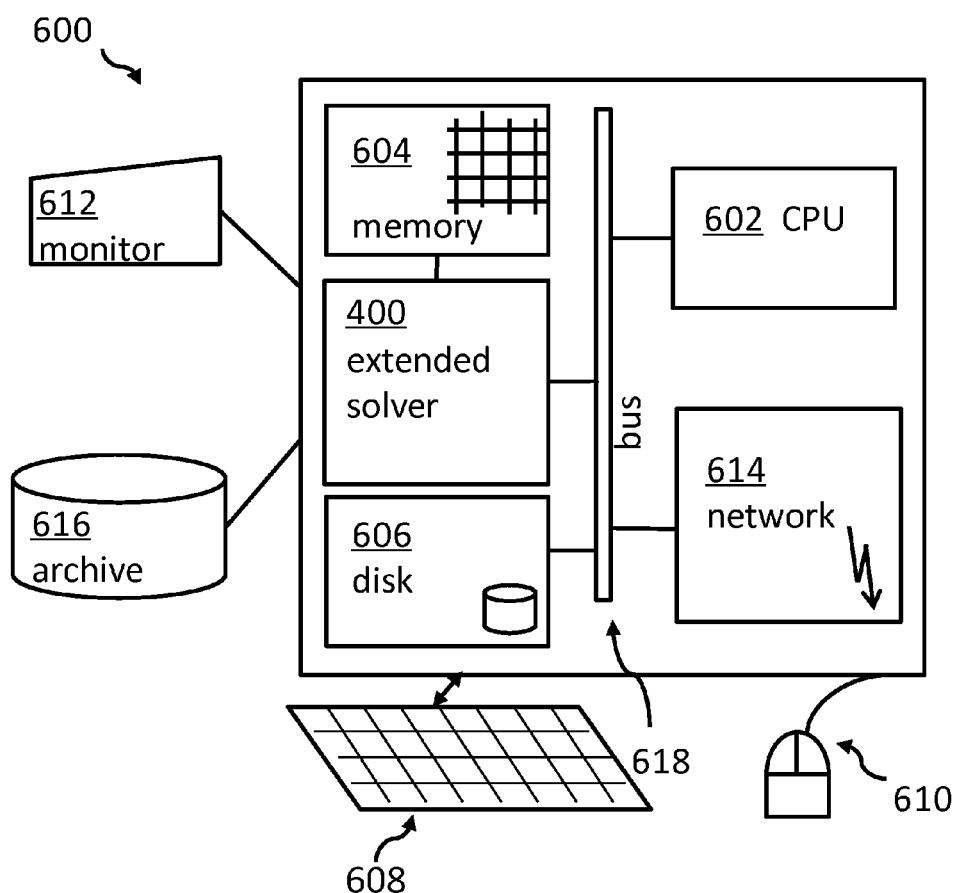

Preferred embodiments of the invention are described, by way of example only, and with reference to the following drawings:

FIG. 1 shows a flowchart for solving a linear equation system using a hardware-implemented extended solver, in accordance with an embodiment of the present invention;

FIG. 2 shows a block diagram of a multi-grid voxel, in accordance with an embodiment of the present invention;

FIG. 3 shows a block diagram of a vector which illustrates how different resolutions of involved data may be implemented, in accordance with an embodiment of the present invention;

FIG. 4 shows a block diagram of an extended solver architecture, in accordance with an embodiment of the present invention;

FIG. 5 shows a higher level block diagram of an extended solver for solving a linear equation system, in accordance with an embodiment of the present invention; and FIG. 6 shows a block diagram of internal and external components of a computing system comprising an extended solver, in accordance with an embodiment of the present invention.

DETAILED DESCRIPTION

Embodiments of the present invention recognize that matrices describing a 3D (three dimensional) model, the underlying technical problem, and the related linear equation systems used to solve these technical problems may become large. Typically, the methods for solving the equations are memory intensive (e.g., memory-bound, requiring a lot of memory). Embodiments of the present invention recognize that memory used for storing the technical task and finding the solution can be scarce because of limited memory availability. In some instances, using a lower precision may not solve the problem because additional memory may be required to store data in a lower precision. Conversely, using a higher precision require even more memory. Embodiments of the present invention provide solutions for improving the precision of a linear equation system using a hardware-implemented extended solver. In this manner, as discussed in greater detail in the specification, embodiments of the present invention offer an extended solver that can calculate problems "on-the-fly" without using large amounts of memory. Embodiments of the present invention may offer a couple of advantages:

The required memory for the proposed solution is only the memory required for the data in the highest resolution (i.e., the data that contains the most details). Other resolutions or levels for the iterative solution are superimposed on the data having the highest resolution. In this embodiment, the data inputted to the solver for the linear equation system can be reduced in resolution and/or precision during access to the data. Thus, only one resolution—in fact the highest resolution data—is stored. This delivers a technical solution to the problem of limited memory resources for hardware implemented solvers for linear equation systems. There are also no requirements to manage several sets of the same data in different resolutions. Implementing the calculation of a lower resolution in hardware as part of the memory access unit enables an "on-the-fly"—meaning during memory access—resolution or precision reduction. In one advantageous embodiment, the "on-the-fly" conversion may be performed during the process of moving a data value from the main memory to the cache of the CPU for further calculations. In this embodiment, solvers that have calculation engines for different precision input data are not required.

In the context of this description, the following conventions, terms and/or expressions may be used:

The term "linear equation system" may denote a group of equations. The term system may indicate that the equations have to be considered collectively. If, for example, the equations are linearly independent from each other, then one solution may exist for a given linear equation system. Linear equation systems are the basis and a fundamental part of linear algebra and may be interpreted here in this sense.

The term "hardware-implemented extended solver" may denote a calculation engine implemented in hardware for calculating results of linear equation system. The extended solver may comprise a "conjugate gradient solver" (see below).

The term "calculation precision" may denote the mathematical precision in which a calculation is performed. The precision may be measured in bits per variable used as input and/or output value of a mathematical operation. Examples may be single precision, double precision, etc.

The term "three-dimensional finite element voxel model" may denote a mathematical model based on voxels. A voxel may represent a value in a regular grid in three-dimensional space. The term "voxel" is a portmanteau for "volume" and "pixel" where pixel is a combination of "picture" and "element". As with pixels in a bitmap, voxels themselves do not typically have their position (i.e., their coordinates) explicitly encoded along with their values. Instead, the position of a voxel is inferred based upon its position relative to other voxels (i.e., its position in the data structure that makes up a single volumetric image). In contrast to pixels and voxels, points and polygons are often explicitly represented by the coordinates of their vertices. A direct consequence of this difference is that polygons are able to efficiently represent simple 3D structures with lots of empty or homogeneously filled space, while voxels are good at representing regularly sampled spaces that are non-homogeneously filled.

The term "conjugate gradient solver" may denote a calculation engine adapted for calculating a numerical solution of particular systems of linear equations, namely those whose matrix is symmetric and positive-definite. The conjugate gradient method is an iterative algorithm, applicable to sparse systems that are too large to be handled by a direct implementation or other direct methods such as the Cholesky decomposition. Large sparse systems often arise when numerically solving partial differential equations or optimization problems. The conjugate gradient solver is often used as an "inner solver" in an "iterative refinement" algorithm, which is again iterative and provides the "outer loop".

The term "memory access unit" may denote a component of a computer instrumental for accessing data in a main memory (e.g., for a usage in a register of a CPU (central processing unit)). The memory access unit may fetch the data from one or more memory cells and may transfer it to the CPU or a cache. In the embodiments described here, a memory access unit may fulfill an additional task, namely reducing the mathematical precision of a data value such that a solver may only need to perform calculations in a lower precision. This may have computing speed advantages.

The term "interpolation unit" may denote a hardware-implemented component of a computer adapted for constructing new data points within the range of a discrete set of known data points.

According to a preferred embodiment of the method, the hardware-implemented extended solver is based on a conjugate gradient solver. Such a solver may accept two stop criteria: (a) a tolerance value or (b) the number of iterations to be performed.

According to another preferred embodiment of the method, the "on-the-fly" interpolations are performed by a memory access unit during memory access to the data in the highest resolution of the three-dimensional finite element voxel model. This may allow storing the data of the voxel model in the highest resolution only. If required, the data may be converted to a lower precision in order to be used as input for the generic solver for a faster calculation. Not every interpolation step may need to be executed in the highest possible resolution. The "on-the-fly" conversion or interpolation to a lower resolution by the memory access unit allows for a high speed conversion in hardware. No additional overhead may be required and it may not be required to adapt the generic solver.

According to a further embodiment of the method, a predefined number of initial iteration steps may be performed using the highest resolution instead of reducing the calculation resolution already in the first or second level (i.e., the second step—levels may start with the index zero). A number of predefined initial iteration steps may be determined by experiments (i.e., experientially based). A fast conversion of the interactive solver calculations may be guaranteed if the initial steps are performed with data in the highest precision. Following iteration steps—higher levels—may be performed using data of the voxel model in a lower precision in order to still enable a fast convergence of the solving calculation steps by the solver. At the end of the iterations steps—before reaching a stop criterion—a higher precision may be instrumental again for a fast convergence process.

In one advantageous embodiment of the method, the resolution of the performing solving computations may be adaptable from one iteration step at one level to a next iteration step (i.e., the next interaction step) as being performed with a higher, a lower or an equal precision as the one level. Thus, the calculation precision, and consequently the precision of the data required as input, may only be required in a lower precision than the highest available precision. The calculation precision may be adapted to be a higher or lower precision from step to step of the iteration algorithm. The generic solver may be adapted to change the calculation precision from iteration step to iteration step (i.e., from level to level).

According to an additional embodiment of the method, a next lower resolution level of the iteration step may be achieved by splitting each dimension of the three-dimensional finite element voxel model in half. This may be a straight forward method to reduce the number of voxels for an interactive step. Hence, the required number of calculation steps may be reduced by a factor of eight from one iteration to a next iteration (i.e., by a factor of two per dimension).

According to one preferred embodiment of the method, the memory access unit performing the "on-the-fly" interpolations may be programmable. It may, in particular, be programmable in a way to influence the interpolation depending whether a voxel is inside the volume model or at an edge, or a hole inside of the model. In each case, a different interpolation schemes may be used, by involving different sets of points.

According to one additionally preferred embodiment of the method, the memory access unit performing the "on-the-fly" interpolation calculates, for a missing voxel on an edge of the three-dimensional finite element voxel model, a value depending on neighboring voxels of the missing voxel. Thus, not a zero value may be used for a missing voxel but an interpolation of other edge values. This may result in a more accurate calculation and faster convergence of the iteration steps.

In the following, a detailed description of the figures will be given. All instructions in the figures are schematic. Firstly, a flowchart of an embodiment of the inventive method for solving a linear equation system using a hardware-implemented extended solver is given. Afterwards, further embodiments as well as embodiments of an extended solver for solving a linear equation system are described.

FIG. 1 shows a flowchart 100 for solving a linear equation system using a hardware-implemented extended solver, in accordance with an embodiment of the present invention. In this embodiment, a calculation precision is adapted in each iteration step of a related solving process.

In step 102, a memory access unit stores data about a highest resolution of a three-dimensional finite element voxel model in a memory.

In step 104, the memory access unit performs solving computations in a lower resolution than the highest resolution by an extended solver (e.g., extended solver 400) which is adapted for performing "on-the-fly" interpolations using the data in the highest resolution of the three-dimensional finite element voxel model to the lower resolution as well as solving computations in the lower resolution, as discussed in greater detail in FIGS. 2-4. As discussed above, in this embodiment, the "on-the-fly" interpolations are performed in hardware by a memory access unit(s).

FIG. 2 shows a diagram of multi-grid voxel 200, in accordance with an embodiment of the present invention. In this embodiment, multi-grid voxel 200 shows how a restriction operation R may be understood from level l to a level l+1 of iterations. When moving from a level l to a level l+1 each dimension x, y, z of the corresponding voxel model is split in half. Thus, one voxel on level l+1 corresponds to eight voxels on the foregoing level l.

Voxel model 202 shows eight voxels which is representative of a higher resolution voxel. As examples in voxel model 202, voxel v1, 204 and voxel v2, 206 are enumerated. Two voxels (e.g., voxels 204 and 206) may make up two points of a cube. Two basic operations may be required when moving from level l to level l+1. Firstly, a restriction from l to l+1; and secondly, an interpolation I of corresponding data values. In hardware, two corresponding activities are done: firstly, a new multi-grid level is set; secondly, n contingent gradient iterations are started, whereby, the first round or level l marks a starting point and it continues to level l+1, level l+2, etc. In other embodiments, a first round of iterations that correspond to the first levels (e.g., l+1, level l+2) may be performed in the highest resolution (as opposed to reducing the resolution level already with the next level) based, at least in part, on a preset number of levels as determined by experience.

Voxel 208 is representative of a lower resolution. Voxel 208 shows only one cube corresponding to v1, 210. However, the data values of voxel v1, 204 of the higher resolution voxel model 202 and the voxel v1, 210 from voxel model 208 having a lower resolution may correspond directly to each other (compare double arrow 214), whereas voxel v2, 206 of voxel model 202 and voxel v2, 212 of voxel model 208 of the lower resolution may not correspond to each other because of the interpolation required to arrive at voxel v2, 212. Voxel 212 of level l+1 may represent another cube which is not shown.

FIG. 3 shows a diagram of vector 300 of vector 300 which illustrates how different resolutions of involved data (e.g., restriction and interpolation) may be implemented, in accordance with an embodiment of the present invention. In this embodiment, an example of a vector is shown; however, the same principles may be applied to matrices of the voxel model.

For illustrative purposes, the following discussion is made with respect to three levels: l, l+1, and l+2. Elements 302, 304, and 306 are voxel data points in a voxel model that correspond to those three levels respectively. For example, elements 302 are voxel data points in a voxel model that belong to level l. Elements 304 are voxel data points that belong to level l+1. Elements 306 are voxel data points in a voxel model that belong to level l+2. It may be noted that the real data value of corresponding elements 302, 304, 306 are not the same. This may only be a schematic representation to demonstrate the reduction in data elements (e.g., voxel in a 3D model, of a vector 302). Thus, two sets of elements C and F may exist: C may be vector elements cf in a coarser grid, and F may be vector elements f in a finer grid. The restriction operation R may be performed for all elements c in C based on elements f of neighbors of c.

The interpolation operation I may be performed in two steps: (a) in parallel for all intermediate elements f from F with no corresponding c in C: compute f=function of c and neighboring c. (b) in parallel for all intermediate elements f from F with corresponding c in C: compute f=function of c and direct neighbors c. This algorithm works because all c in C elements projected into the finer grid are separated in all directions x, y, z by at least one other element. Therefore, updates of one c may not interfere with computations of another c.

Corresponding R and I operations on a matrix may be performed using the following principles:

$$A^l = 2^l \Sigma_{e \in \Omega l} E_e^l T_e^l A_{ref} T_e^{lT}, \quad \text{Formula 1}$$

wherein E may be Young's modulus and $T_e^l$ and $T_e^{lT}$ represent a mapping of local to global degrees of freedom.

It follows, that:

$$E_e^{l+1} = \frac{1}{8} \Sigma_{e^\wedge \in \Omega l} E_e^l, \quad \text{Formula 2}$$

wherein E on level l+1 is represented by eight neighboring E on level l, wherein non-existing child elements are zero. The hardware (i.e., the memory) stores $A^0$, i.e., the finest grained matrix, i.e., the one with the highest resolution—and computes $A^{l+1}$ on-the-fly (e.g., while transferring data from memory to the CPU cache).

It may be noted that a more comprehensive explanation of the above principles may be found in "Bone structures analysis on multiple GPGPUs", *Journal of Parallel and Distributed Computing*, Volume 74, Issue 10, Pages 294-2950, October 2014, P. Arbenz, C. Flaig, G. Kellenberger which is incorporated herein by reference.

FIG. 4 shows a block diagram of an extended solver architecture 400, in accordance with an embodiment of the present invention. Vector data values may be stored in vector memory 402 and matrix data values (i.e., voxel model data values) may be stored in matrix memory 404. Both may be part of the main memory of a computer. Level select unit 406 transmits a current problem size information to generic iterative solver 408. Tolerance value 410 and number of iterations 412 are inputted as an input value and stop criteria, respectively and can be accessed during an iteration. Generic iterative solver 408 may be implemented in hardware or in software.

Level select unit 406 also transmits the current level information to vector address generator 414 and vector R/I unit 416. Vector address generator 414 transmits the address for a data value with index I to vector R/I unit 416. Responsive to receiving the address for a data value, a read/write action may be performed between vector R/I unit 416 and solver 408 on data path 418.

In this embodiment, a corresponding data flow may happen on the matrix side (i.e., the lower part of FIG. 4). For example, level select unit 406 can transmit current level information to matrix address generator 420. Responsive to receiving current level information, matrix address generator 420 transmits the address for data values with index i and j of the matrix accessed from matrix memory 404 to matrix R/I unit 422. Responsive to transmitting the address for data values of i and j, a read action is performed between matrix R/I unit 422 and generic iterative solver 408 on data path 424. Matrix R/I unit 422 may then compute the restricted and interpolated values for $A(i,j)^l$ which may be used as input values for generic iterative solver 408.

It may be noted that the above-mentioned memory access unit may correspond to a combination of vector address generator 414 and vector R/I unit 416 as well as vector address generator 420, and vector R/I unit 422, respectively.

Accordingly, a converged elements bit field (i.e., the final result of the operation such as a simulation of a force acting on a 3D body), may be stored in converted elements bit field 426. The optimized data (i.e., the converged elements bit filed) can be manipulated for visual display in any manner desirable to the user.

FIG. 5 shows a higher level block diagram of extended solver 500 for solving a linear equation system, in accordance with an embodiment of the present invention. As discussed above, a calculation precision may be adapted in each iteration step of a related solving process. Extended solver 500 comprises storage unit 502 adapted for storing data about a highest resolution of a three-dimensional finite element voxel model in a memory, and interpolation unit 504 adapted for performing "on-the-fly" interpolations resulting in the data in lower resolution than the highest resolution. Extended solver 500 comprises generic iterative solver 508 adapted for performing solving computations in a predefined resolution. For example, generic iterative solver 508 could be generic iterative solver 408. Interpolation unit 504 may be adapted for performing "on-the-fly" interpolations using the data in the highest resolution of the three-dimensional finite element voxel model to a lower resolution than the highest resolution. Generic iterative solver 508 may be adapted for solving computations in the lower resolution. Generic iterative solver 508 may also correspond to the combination of vector address generator 414 and vector R/I unit 416 as well as vector address generator 420 and vector R/I unit 422, respectively.

Embodiments of the invention may be implemented together with virtually any type of computer, regardless of the platform being suitable for storing and/or executing program code, as discussed in greater detail in FIG. 6.

FIG. 6 shows a block diagram of internal and external components of computing system 600, which is representative of the computer systems of FIG. 5, which comprises an extended solver, in accordance with an embodiment of the present invention. For example, computing system 600 may include one or more processor(s) 602 with one or more cores per processor, associated memory elements 604, internal storage device 606 (details see below), and numerous other elements and functionalities, typical of today's computers (not shown). Memory elements 604 may include a main memory (e.g., a random access memory (RAM)) employed during actual execution of the program code, and a cache memory, which may provide temporary storage of at least some program code and/or data in order to reduce the number of times, code and/or data must be retrieved from a long-term storage medium or external bulk storage 616 for an execution. Elements inside the computer 600 may be linked together by means of bus system 618 with corresponding adapters. Additionally, extended solver 400 may be connected to bus system 618. A cache memory may also be present between the main memory and the one or more processor building the CPU. It may also be noted that parts of the extended solver may make use of the main memory.

Computing system 600 may also include input means such as keyboard 608, pointing device such as mouse 610, or a microphone (not shown). Alternatively, the computing system may be equipped with a touch sensitive screen as main input device. Furthermore, the computer 600, may include output means such as a monitor or screen 612 [e.g., a liquid crystal display (LCD), a plasma display, a light emitting diode display (LED), or cathode ray tube (CRT) monitor]. Computer system 600 may be connected to a network [e.g., a local area network (LAN), a wide area network (WAN)], such as the Internet or any other similar type of network, including wireless networks via network interface connection 614. This may allow a coupling to other computer systems, or a storage network, or a tape drive. Those, skilled in the art will appreciate that many different types of computer systems exist, and the aforementioned input and output means may take other forms. Generally speaking, computer system 600 may include at least the minimal processing, input and/or output means, necessary to practice embodiments of the invention.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or another devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for solving a linear equation system using a hardware-implemented extended solver, wherein a calculation precision is adapted in each iteration step of a solving process, the method comprising:
    storing, by one or more computer processors, data associated with a highest resolution of a three-dimensional finite element voxel model in a memory;
    performing, by one or more computer processors, on-the-fly interpolations using the data associated with the highest resolution of the three-dimensional finite element voxel model to a lower resolution than the highest resolution, wherein
        the on-the-fly interpolations are performed by a memory access unit during memory access to the data in the highest resolution of the three-dimensional finite element voxel model; and
    performing, by one or more computer processors, solving computations of the solving process in the lower resolution.

2. The method of claim 1, wherein a specified number of initial iteration steps are performed in the highest resolution.

3. The method of claim 1, wherein a resolution of the solving computations of the solving process is adaptable from a first iteration step to a second iteration step of the solving process to be performed with a higher level of precision than a first level of precision, a lower level of precision than the first level of precision, or an equal level of precision as the first level of precision.

4. The method of claim 1, wherein a next lower resolution level of an iteration step of the solving process is splitting each dimension of the three-dimensional finite element voxel model in half.

5. The method of claim 1, wherein performing, by one or more computer processors, on-the-fly interpolations using the data associated with the highest resolution of the three-dimensional finite element voxel model to a lower resolution than the highest resolution comprises:
    receiving, by one or more computer processors, problem parameters;
    receiving, by one or more computer processors, one or more addresses associated with data values;
    calculating, by one or more computer processors, for a missing voxel on an edge of the three-dimensional finite element voxel model, a value depending on neighboring voxels of the missing voxel based, at least in part, on the received one or more addresses associated with the data values and the problem parameters; and
    storing, by one or more computer processors, the calculated missing voxel.

6. The method of claim 5, wherein the problem parameters comprise:
    size information associated with a current problem, tolerance values, and a number of iterations.

7. A computer program product for solving a linear equation system using a hardware-implemented extended solver, wherein a calculation precision is adapted in each iteration step of a solving process, the computer program product comprising:
    one or more computer readable storage media and program instructions stored on the one or more computer readable storage media, the program instructions comprising:
        program instructions to store data associated with a highest resolution of a three-dimensional finite element voxel model in a memory;
        program instructions to perform on-the-fly interpolations using the data associated with the highest resolution of the three-dimensional finite element voxel model to a lower resolution than the highest resolution, wherein
            the on-the-fly interpolations are performed by a memory access unit during memory access to the data in the highest resolution of the three-dimensional finite element voxel model; and
        program instructions to perform solving computations of the solving process in the lower resolution.

8. The computer program product of claim 7, wherein a specified number of initial iteration steps are performed in the highest resolution.

9. The computer program product of claim 7, wherein a resolution of the solving computations of the solving process is adaptable from a first iteration step to a second iteration step of the solving process to be performed with a higher level of precision than a first level of precision, a lower level of precision than the first level of precision, or an equal level of precision as the first level of precision.

10. The computer program product of claim 7, wherein a next lower resolution level of an iteration step of the solving process is splitting each dimension of the three-dimensional finite element voxel model in half.

11. The computer program product of claim 7, wherein the program instructions to perform on-the-fly interpolations using the data associated with the highest resolution of the three-dimensional finite element voxel model to a lower resolution than the highest resolution comprise:
program instructions to receive problem parameters;
program instructions to receive one or more addresses associated with data values;
program instructions to calculate for a missing voxel on an edge of the three-dimensional finite element voxel model, a value depending on neighboring voxels of the missing voxel based, at least in part, on the received one or more addresses associated with the data values and the problem parameters; and
program instructions to store the calculated missing voxel.

12. The computer program product of claim 11, wherein the problem parameters comprise:
size information associated with a current problem, tolerance values, and a number of iterations.

13. A computer system for solving a linear equation system using a hardware-implemented extended solver, wherein a calculation precision is adapted in each iteration step of a solving process, the computer system comprising:
one or more computer processors;
one or more computer readable storage media; and
program instructions stored on the one or more computer readable storage media for execution by at least one of the one or more computer processors, the program instructions comprising:
program instructions to store data associated with a highest resolution of a three-dimensional finite element voxel model in a memory;
program instructions to perform on-the-fly interpolations using the data associated with the highest resolution of the three-dimensional finite element voxel model to a lower resolution than the highest resolution, wherein
the on-the-fly interpolations are performed by a memory access unit during memory access to the data in the highest resolution of the three-dimensional finite element voxel model; and
program instructions to perform solving computations of the solving process in the lower resolution.

14. The computer system of claim 13, wherein a specified number of initial iteration steps are performed in the highest resolution.

15. The computer system of claim 13, wherein a resolution of the solving computations of the solving process is adaptable from a first iteration step to a second iteration step of the solving process to be performed with a higher level of precision than a first level of precision, a lower level of precision than the first level of precision, or an equal level of precision as the first level of precision.

16. The computer system of claim 13, wherein a next lower resolution level of an iteration step of the solving process is splitting each dimension of the three-dimensional finite element voxel model in half.

17. The computer system of claim 13, wherein the program instructions to perform on-the-fly interpolations using the data associated with the highest resolution of the three-dimensional finite element voxel model to a lower resolution than the highest resolution comprise:
program instructions to receive problem parameters;
program instructions to receive one or more addresses associated with data values;
program instructions to calculate for a missing voxel on an edge of the three-dimensional finite element voxel model, a value depending on neighboring voxels of the missing voxel based, at least in part, on the received one or more addresses associated with the data values and the problem parameters; and
program instructions to store the calculated missing voxel.

* * * * *